(12) United States Patent
Itoh et al.

(10) Patent No.: US 11,043,275 B2
(45) Date of Patent: Jun. 22, 2021

(54) MEMORY SYSTEM, READ METHOD, PROGRAM, AND MEMORY CONTROLLER

(71) Applicant: TOSHIBA MEMORY CORPORATION, Tokyo (JP)

(72) Inventors: Takayuki Itoh, Kanagawa (JP); Tomoya Kodama, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 110 days.

(21) Appl. No.: 16/119,978

(22) Filed: Aug. 31, 2018

(65) Prior Publication Data

US 2019/0279724 A1  Sep. 12, 2019

(30) Foreign Application Priority Data

Mar. 6, 2018  (JP) .............................. JP2018-039775

(51) Int. Cl.
| | |
|---|---|
| *G11C 16/26* | (2006.01) |
| *G11C 16/04* | (2006.01) |
| *G11C 11/56* | (2006.01) |
| *G06F 3/06* | (2006.01) |
| *H01L 29/792* | (2006.01) |

(52) U.S. Cl.
CPC ............ *G11C 16/26* (2013.01); *G06F 3/0617* (2013.01); *G06F 3/0658* (2013.01); *G06F 3/0679* (2013.01); *G11C 11/5671* (2013.01); *G11C 16/0483* (2013.01); *H01L 29/7923* (2013.01)

(58) Field of Classification Search
CPC . G11C 16/0483; G11C 16/26; G11C 11/5671; G06F 3/0617; G06F 3/0658; G06F 3/0679; H01L 29/7923
See application file for complete search history.

(56) References Cited

U.S. PATENT DOCUMENTS

| | | | |
|---|---|---|---|
| 6,879,520 B2 | 4/2005 | Hosono et al. | |
| 7,864,593 B2 * | 1/2011 | Taeuber | G11C 11/5614 365/185.24 |
| 8,891,296 B2 * | 11/2014 | Ma | G11C 16/3431 365/185.02 |
| 10,360,101 B2 | 7/2019 | Kodama et al. | |
| 10,545,819 B1 * | 1/2020 | Lu | G06F 11/1072 |
| 2008/0062758 A1 * | 3/2008 | Honma | G11C 11/5642 365/184 |
| 2008/0239805 A1 * | 10/2008 | Shiga | G11C 11/5628 365/185.03 |
| 2010/0149868 A1 * | 6/2010 | Yoo | G11C 11/5628 365/185.03 |

(Continued)

FOREIGN PATENT DOCUMENTS

JP  3913704 B2  5/2007

*Primary Examiner* — Eric T Oberly
(74) *Attorney, Agent, or Firm* — Foley & Lardner LLP (57) ABSTRACT

According to one embodiment, a memory system includes a nonvolatile memory and a memory controller. The nonvolatile memory includes a first word line including a plurality of first cells and a second word line adjacent to the first word line and including a plurality of second cells. The memory controller determines a read voltage to be used with respect to the plurality of the first cells, according to a plurality of adjacent voltages representing respective threshold voltages of the plurality of the second cells. The memory controller reads data from the first word line using a plurality of determined read voltages.

11 Claims, 8 Drawing Sheets

(56) References Cited

U.S. PATENT DOCUMENTS

| | | | |
|---|---|---|---|
| 2012/0033499 A1* | 2/2012 | Kim | G11C 11/26 365/185.18 |
| 2017/0358364 A1* | 12/2017 | Yang | G06F 3/064 |
| 2018/0254090 A1* | 9/2018 | Dutta | G11C 29/021 |
| 2020/0005878 A1* | 1/2020 | Lu | G11C 11/5671 |

* cited by examiner

MEMORY SYSTEM, READ METHOD, PROGRAM, AND MEMORY CONTROLLER

CROSS-REFERENCE TO RELATED APPLICATIONS

This application claims the benefit of and priority to Japanese Patent Application No. 2018-039775, filed Mar. 6, 2018, the entire contents of which are incorporated herein by reference.

FIELD

Embodiments described herein relate generally to a memory system, a read method, a program, and a memory controller.

BACKGROUND

As a capacity of a NAND flash memory used for a solid state drive (SSD) or a memory card grows, a problem occurs in reliability thereof. For example, if a distance between memory cells decreases due to a process shrink, a threshold voltage of the memory cell may be influenced by interference between adjacent memory cells (Cell-to-Cell Interference (CCI)) when the threshold voltage is written to the memory cell.

In a charge trap type NAND flash memory or the like, a phenomenon (referred to as lateral migration of electric charges) may occur in which electric charges stored in the memory cell move to an adjacent cell, according to a difference between threshold voltages of adjacent memory cells (or adjacent cells). Due to the lateral migration of electric charges, change amounts (hereinafter, referred to as adjacent influence amounts) of the threshold voltage vary depending on the threshold voltages of the adjacent cells, in the same manner as the CCI. Meanwhile, unlike the CCI, in the lateral migration of electric charge, the adjacent influence amount changes with time.

A method is known in which, when reading from the memory cell is made, influence of the CCI is reduced by making the reading under different conditions according to data of a memory cell adjacent to the memory cell.

DETAILED DESCRIPTION

However, in the related art, bit errors caused by lateral migration may not be appropriately reduced. As described above, for example, in a charge trap type NAND flash memory, an adjacent influence amount changes with time owing to existence of lateral migration of electric charges. Accordingly, even if a method of reducing influence due to CCI in the related art is applied, an error may not be accurately reduced.

In general, according to one embodiment, a memory system includes a nonvolatile memory and a memory controller. The nonvolatile memory may include a first word line including a plurality of first cells and a second word line adjacent to the first word line and including a plurality of second cells. The memory controller may determine a read voltage to be used with respect to a plurality of the first cells, according to a plurality of adjacent voltages representing respective threshold voltages of the plurality of the second cells. The memory controller may read data from the first word line using a plurality of determined read voltages.

Hereinafter, a memory system, a read method, a program, and a memory controller according to an embodiment will be described in detail with reference to the accompanying drawings. In the following description, the same reference numerals or symbols are attached to configuration elements having the same function, and duplicate description thereof will be appropriately omitted.

The memory system according to some embodiments may determine a voltage (or read voltage) to be used when reading data of each cell of a word line to be read, according to a threshold voltage (or adjacent voltage) of a cell in a word line adjacent to the word line to be read, before the read processing is performed. For example, a plurality of read voltages are determined based on a level of the threshold voltage of the cell in an adjacent word line. During the read processing, data may be read from each cell of the word line to be read by using a read voltage corresponding to the threshold voltage of the cell of the adjacent word line. With such a configuration, it is possible to more appropriately prevent bit errors caused by lateral migration.

Figure 1:
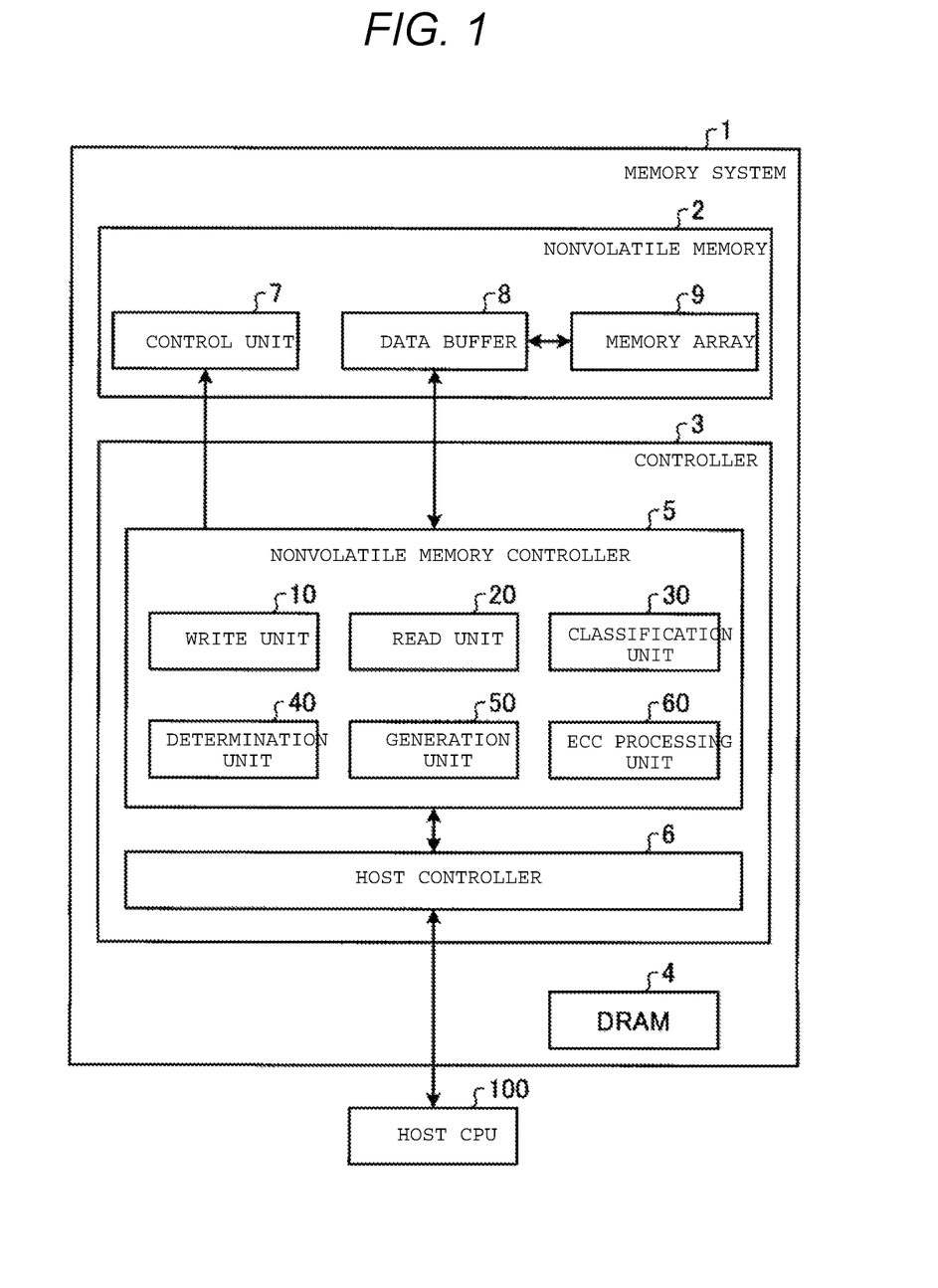
FIG. 1 is a block diagram illustrating a configuration example of a memory system according to some embodiments.

FIG. 1 is a block diagram illustrating a configuration example of a memory system 1 according to some embodiments. The memory system 1 illustrated in FIG. 1 includes a nonvolatile memory 2, a controller 3, and a dynamic random access memory (DRAM) 4, and may operate in accordance with a command from a host CPU 100. The nonvolatile memory 2 is, for example, a NAND flash memory.

A write command or a read command from the host CPU 100 to the memory system 1 may be sent to the controller 3. The controller 3 may control the nonvolatile memory 2 in accordance with a command from the host CPU 100, write data to the nonvolatile memory 2, and read data from the nonvolatile memory 2. Although FIG. 1 illustrates an example in which the nonvolatile memory 2 and the controller 3 are in one-to-one correspondence, the controller 3 may control a plurality of nonvolatile memories 2.

In some embodiments, the controller 3 includes a nonvolatile memory controller 5 and a host controller 6. The controller 3 or the nonvolatile memory controller 5 of the controller 3 may be a memory controller.

The host controller 6 may transmit and receive data in accordance with a command issued from the host CPU 100. Specifically, the host controller 6 may perform processing of converting address information (for example, logical block address (LBA)) indicated by the host CPU 100 into a physical address space of the nonvolatile memory 2.

Meanwhile, the nonvolatile memory controller 5 may control the nonvolatile memory 2, based on a signal sent from the host controller 6. Specifically, the nonvolatile memory controller 5 may send a command and an address to the nonvolatile memory 2 to write and read data.

In some embodiments, the nonvolatile memory controller 5 includes a write unit 10, a read unit 20, a classification unit 30, a determination unit 40, and a generation unit 50. The nonvolatile memory controller 5 may further include an error correction code (ECC) processing unit 60.

The write unit 10 may write data to the nonvolatile memory 2 by sending a command or address information or by sending data to be written to the nonvolatile memory 2. An error correction code may be added to the data sent as write data from the host CPU 100 by the ECC processing unit 60. After the error correction code is added, processing of randomizing the data may be performed.

Writing data to the nonvolatile memory 2 may be performed by setting a threshold voltage of each memory cell of a memory cell group designated by the address information to a voltage level corresponding to the data (hereinafter, referred to as "write data"). That is, the write data may be stored by means of the threshold voltage of each memory cell of the memory cell group.

The read unit 20 may read data from the nonvolatile memory 2 by sending a command and address information to the nonvolatile memory 2. The data read from the nonvolatile memory 2 may be error-corrected by the ECC processing unit 60.

The classification unit 30 may classify a plurality of cells (or first cells) in a word line (target word line or first word line) to be read into a plurality of classes (or first group of classes) according to the threshold voltages of a plurality of cells (adjacent cells or second cells) in a word line (adjacent word line or second word line) adjacent to the first word line. In some embodiments, the adjacent word line or second word line may be two word lines adjacent to the first word line. In other embodiments, the adjacent word line or second word line may be one of two word lines adjacent to the first word line.

The determination unit 40 may determine a voltage (or read voltage) used for reading data from the memory cell group. In some embodiments, the determination unit 40 may determine the read voltages to be used with respect to each class (i.e., each class of the first group of classes), based on distribution of the threshold voltages of cells belonging to that class. The distribution of the threshold voltages may be, for example, a histogram illustrating the number of cells for each threshold voltage of the cells belonging to each class. In some embodiments, the determination unit 40 may determine the read voltage without using a histogram. For example, the determination unit 40 may determine the read voltage by performing a linear calculation from the number of cells having each threshold voltage. A detailed operation of the determination unit 40 will be described below.

Processing of determining the read voltage by using the classification unit 30 and the determination unit 40 may be performed before processing of reading data (or read processing) is performed by the read unit 20.

The read unit 20 may read data from a memory cell group of a word line to be read, using the read voltage determined by the determination unit 40. For example, the read unit 20 may read data from a word line to be read, using the read voltage determined with respect to a class corresponding to a threshold voltage of cells in an adjacent word line, among a plurality of classified classes (i.e., among the first group of classes).

The generation unit 50 may generate output data to be output to the host CPU 100 or the like as a read result, based on the read data. For example, the generation unit 50 may apply a plurality of masks determined with respect to each class (i.e., each class of the first group of classes), with respect to the data read by using each of a plurality of read voltages determined with respect to a plurality of classes (i.e., the first group of classes), and generate output data obtained by integrating the application results of the plurality of masks. Details of generation processing of the output data will be described below.

In some embodiments, the nonvolatile memory 2 includes a control unit 7, a data buffer 8, and a memory array 9. The control unit 7 may interpret a command or address information issued from the controller 3, and control the data buffer 8 or the memory array 9. The write data may be temporarily stored in the data buffer 8 and then written in the memory array 9. In a case of reading, the data read from the memory array 9 may be temporarily stored in the data buffer 8 and may be sequentially sent to the controller 3.

The DRAM 4 may be a storage unit (or a storage) that stores various data being used in various types of processing by the memory system 1. For example, the DRAM 4 stores information indicating the determined read voltage. The memory system 1 may include a static random access memory (SRAM) instead of the DRAM 4. Alternatively, a part of the nonvolatile memory 2 may be used instead of the DRAM 4.

Figure 2:
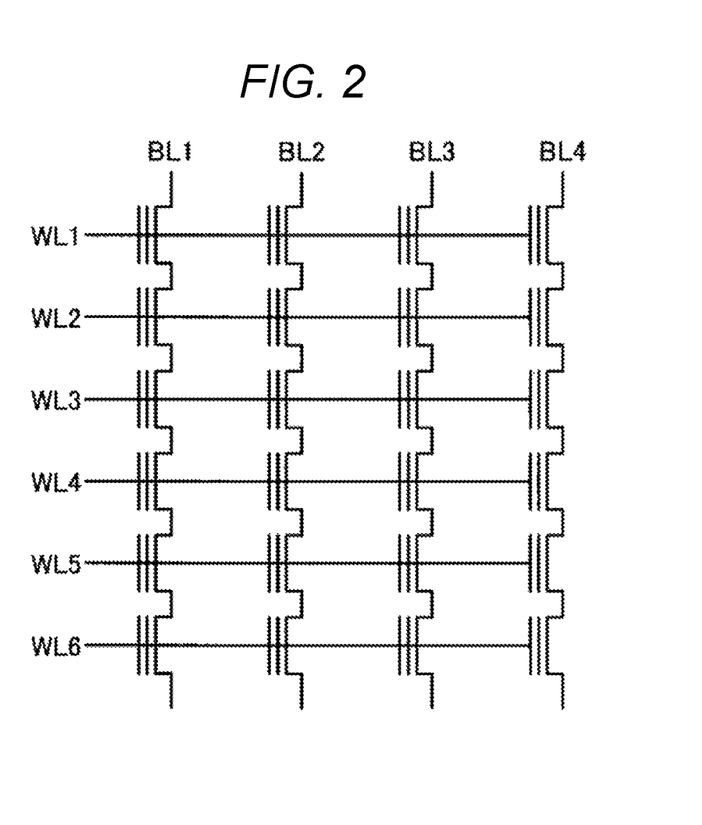
FIG. 2 is a diagram illustrating a structure of a memory array of a nonvolatile memory according to some embodiments.

FIG. 2 is a diagram illustrating a structure of the memory array 9 of the nonvolatile memory 2. As illustrated in FIG. 2, the memory array 9 is configured with a plurality of circuits, each being called a NAND string in which a plurality of transistors (each transistor is called "memory cell") are arranged in series. One NAND string is called a bit line (BL). Gate electrodes of the transistors at the same position of the plurality of bit lines are connected to each other by a line called a word line (WL). Although only four bit lines BL1 to BL4 and six word lines WL1 to WL6 are illustrated in FIG. 2, there may be more bit lines and more word lines, and many memory cells may be arranged in an array.

Data may be written by injecting electric charges into a charge storage layer of a memory cell (or transistor). If the electric charges are stored, the threshold voltage of the memory cell may change depending on the amount of stored electric charges. In a case where data is read, a voltage (or read voltage) is applied to a word line to be read and a read pass voltage (or Vread) is applied to the remaining word lines. In a case where the threshold voltage of the memory cell is lower than the read voltage, the entire bit line can become active (ON), otherwise the bit line can become inactive (OFF). In the nonvolatile memory 2, the active state or the inactive state of each bit line may be sensed by a sense amplifier, and thereby, data can be read from the memory cell.

In the nonvolatile memory 2, data of approximately 1 bit to 4 bits may be recorded in each memory cell (or transistor) whose threshold voltage is variable. In a case where two or more bits are recorded in each cell, data corresponding to the number of bits may be allocated with respect to each threshold level.

Figure 3:
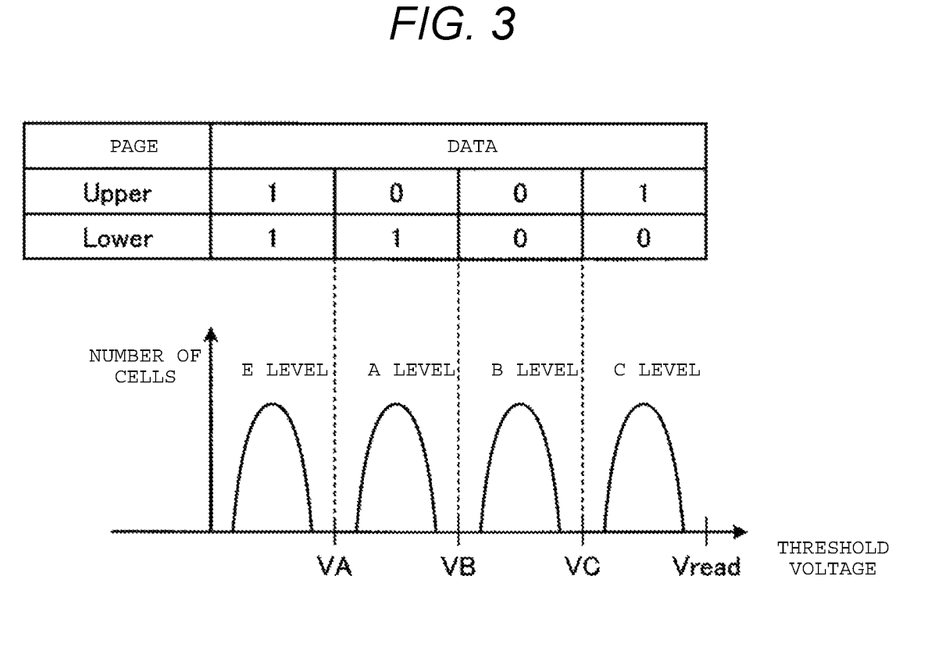
FIG. 3 is a diagram illustrating an example of a data allocation method in the nonvolatile memory according to some embodiments.

FIG. 3 is a diagram illustrating an example of a data allocation method in the nonvolatile memory 2. For example, in a case of recording 2 bits per cell, as illustrated in the example of FIG. 3, 2-bit symbols are allocated to four kinds of threshold levels, respectively. To read a bit from the memory, it may be necessary to apply a plurality of read voltages. In the example of FIG. 3, in a case where a lower page is read, one time of reading may be performed with the read voltage=VB. Meanwhile, in a case where an upper page is read, reading is performed with two patterns of the read voltage=VA and VC.

Figure 4:
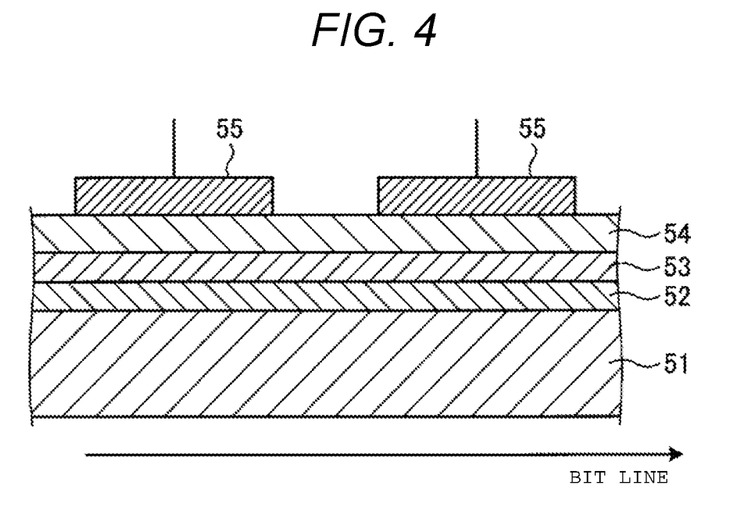
FIG. 4 is a sectional view illustrating a structural example of a memory cell of the nonvolatile memory according to some embodiments.

FIG. 4 is a sectional view illustrating a structural example of a memory cell of the nonvolatile memory 2 according to some embodiments. In a three-dimensional nonvolatile memory according to some embodiments, a charge trap type memory cell illustrated in FIG. 4 is used. The charge trap type memory cell may have a structure in which a substrate 51, a tunnel layer 52, a charge trap layer 53, a blocking layer 54, and a control gate 55 are stacked in this order. While the substrate 51 is a substrate in a 2D NAND flash memory, it is called Poly-Si Channel in a 3D NAND flash memory. In this structure, electric charges may be trapped in a trap formed in the charge trap layer 53, and thereby, a threshold voltage of the memory cell changes. In a case where electric charges for writing are trapped, a high voltage pulse may be applied between the control gate 55 and the substrate 51. By changing strength of the voltage pulse, a pulse width or the number of times, and the like, the amount of electric charges trapped in the charge trap layer 53, that is, the threshold voltage of the memory cell can be controlled.

In the charge trap type memory cell, the charge trap layer 53 is connected to the adjacent memory cell. Since the charge trap layer 53 is an insulator with traps, the written electric charges are not immediately moved to the adjacent memory cell. However, a phenomenon in which electric charges move (lateral migration of electric charge) occurs slowly with time due to influence of heat, an electric field or the like. If the stored charges move, the threshold voltage of the memory cell changes. If the change in the threshold voltage is large, the threshold voltage may eventually overlap the adjacent threshold level (for example, the cell at a C level in FIG. 3 falls within the range of a B level), the written data may change, and thereby, a bit error may occur.

Hereinafter, a method of determining the read voltage using the determination unit 40 will be further described. Generally, a lateral migration speed of the electric charges changes depending on a difference between the threshold voltages of adjacent cells. In a case where the elapse time for the writing of data is the same, the larger the difference of the threshold voltages is, the larger a change range of the threshold voltage due to lateral migration is. In some embodiments, the determination unit 40 determines a plurality of read voltages in consideration of the change in the threshold voltage due to lateral migration of the electric charges, and reads data from the nonvolatile memory 2.

Figure 5:
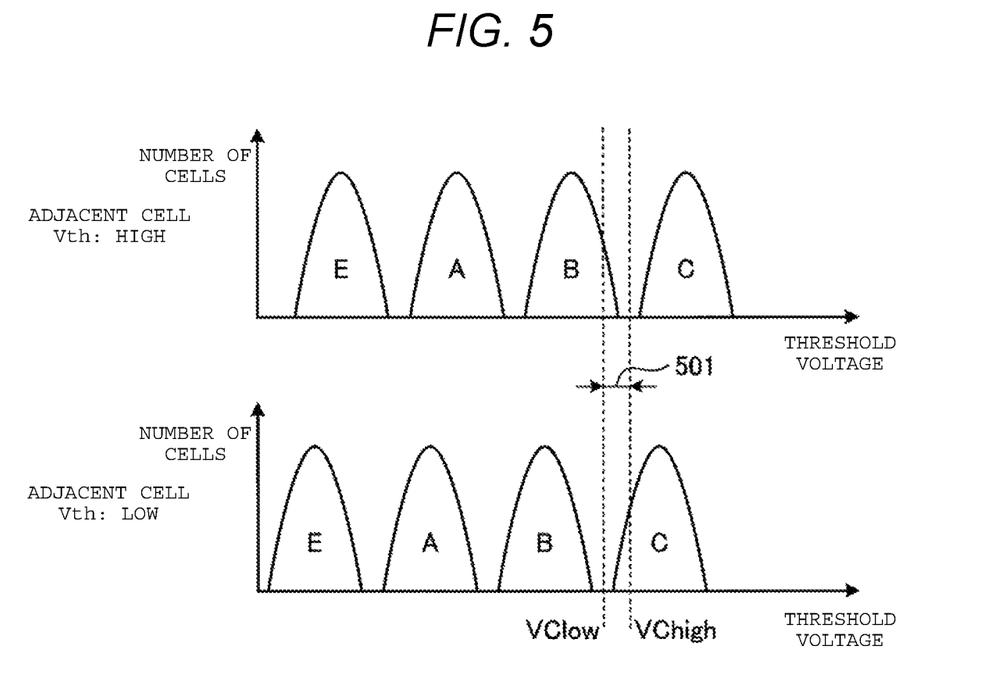
FIG. 5 is a diagram illustrating influence of lateral migration of electric charges according to some embodiments.

As described above, the lateral migration of electric charges proceeds faster as the difference between the threshold voltages of adjacent cells is larger. From this fact, at a certain read timing, a histogram of the threshold voltages of each cell of the word line is drawn for each of classes of the threshold voltages (Vth) of the adjacent cells, as illustrated in FIG. 5. For example, each of the classes of the threshold voltages Vth is determined based on whether or not the threshold voltage Vth of the adjacent cells is equal to or greater than a predetermined value.

As illustrated in FIG. 5, voltages (VA, VB, and VC) for separating each level are different from each other depending on the threshold voltage of the adjacent cell. For example, a difference 501 due to influence of lateral migration occurs between VChigh which is VC in a case where the threshold voltage Vth of the adjacent cell is high and VClow which is VC in a case where the threshold voltage Vth is low.

Since the lateral migration progresses gradually with time, the voltage (e.g., an absolute value or an influence difference) also changes depending on factors such as time, a temperature, a device feature, and the like.

The determination unit 40 may determine the read voltage by performing tracking (or performing threshold tracking), according to, for example, a level of the threshold voltage of the adjacent cell. The tracking is a method of estimating an optimum voltage to be used for reading, based on read data from the nonvolatile memory 2. Any method may be used for the tracking, and, for example, a method of estimating an optimum voltage based on a histogram (or a part thereof) as illustrated in FIG. 3 can be used. For example, the determination unit 40 may determine a voltage that has a minimum frequency of the histogram as the read voltage. Instead of using the minimum frequency itself, a value obtained by modifying the minimum frequency may be used.

In addition, when generating a histogram, the above-described threshold tracking processing may be performed after filter processing for the purpose of reducing noise is performed, or after interpolation processing or the like with respect to an interval between read voltages for the tracking is performed.

The histogram can be generated based on the result of reading a plurality of times while changing the read voltage for tracking from, for example, a cell group (for example, a cell group included on a certain word line). For example, a histogram can be generated by setting the read voltage so as to gradually increase, such as 0, 0.1, 0.2 [V], . . . with respect to a target word line to perform reading, and counting the number of cells whose outputs are changed from "0" (inactive) to "1" (active) at each read voltage.

In a case where the histogram is used for tracking, a part of the histogram corresponding to only the periphery of a voltage necessary for reading the data may be generated without generating the entire histogram (a range of the threshold voltage=0 to Vread). In a case of the example of FIG. 3, reading may be performed around VA and VC in a case of reading an upper page and performed only around VB in a case of reading a lower page, and tracking may be performed after a part of the histogram is generated.

Figure 6:
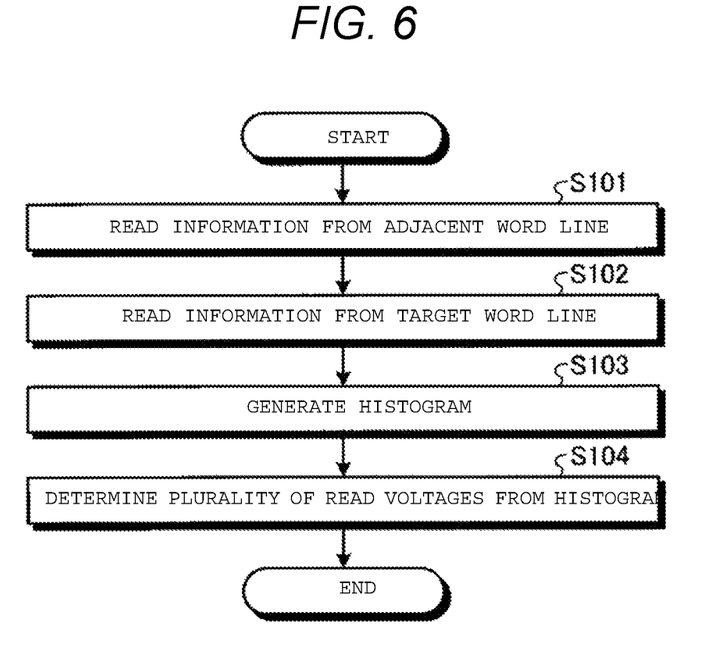
FIG. 6 is a flowchart of read voltage determination processing according to some embodiments.

Next, a flow of read voltage determination processing performed by the memory controller of some embodiments will be described with reference to FIG. 6. FIG. 6 is a flowchart illustrating an example of read voltage determination processing according to some embodiments.

First, the read unit 20 may read data from a word line adjacent to a target word line (step S101). A read voltage to be used at this time may be a voltage of a predetermined value. For example, the voltage VB may be used for the read voltage. A read result is output as an array of values of "0" or "1" depending on whether or not a threshold voltage of each cell on the adjacent word line is higher than VB. The adjacent word line may be a predetermined adjacent word line on one side or may be adjacent word lines on both sides. In addition, the number of times of reading from the adjacent word line on one side may be plural instead of once. Here, a case where the reading from the adjacent word line on one side is performed once will be described, and other cases will be described below.

Next, the read unit 20 reads data to be used for tracking from a target word line (step S102). Thereafter, the tracking is performed based on the read data, and a read voltage is determined (steps S103 and S104). For example, the read voltage is determined by the following sequence.

First, the classification unit 30 may classify each of a plurality of cells in the target word line into one of a plurality of classes (or one of a group of classes), according to the threshold voltage of the adjacent cell. The determination unit 40 may generate a histogram (or a part thereof) for each class corresponding to a level of the threshold voltage of the adjacent cell as illustrated in FIG. 5 (step S103). For example, for each of the plurality of classes, the determination unit 40 may generate a histogram by calculating the number (e.g., the number of cells) for each of the threshold voltages of the cells classified into the class.

Each histogram can be generated, for example, as follows. First, the classification unit 30 may perform a Boolean AND operation of the respective read result (threshold voltage=0 to Vread, or a part thereof) from the target word line and the read results (or Boolean NOT operation of the read result from the adjacent word line) from the adjacent word line.

In a case where the Boolean AND operation is performed by using the read results from the adjacent word line, a cell group having low threshold voltages of adjacent cells among the respective cells of the target word line is extracted. Meanwhile, in a case where the Boolean AND operation is performed by using Boolean NOT operation of the read results from the adjacent word line, a cell group having a high threshold voltage of the adjacent cell is extracted. In other words, the respective cells of the target word line are classified into one of two classes, that is, a class corresponding to a case where a threshold voltage of the adjacent cell is low and a class corresponding to a case where the threshold voltage of the adjacent cell is high, by the Boolean AND operation.

Next, the determination unit 40 may count the number of bits of "1" in the result of the Boolean AND operation. The number of bits corresponds to the number of cells. The determination unit 40 may generate a histogram by taking a difference between a count result (for example, the count result at the time of read voltage=0) for a certain read voltage and a count result (for example, a count result at the time of read voltage=0.1 [V]) for the next read voltage.

The above-described method is merely an example, and a histogram may be generated by another similar method. For example, a method of performing an XOR operation of each read result from the target word line and a next read operation, and counting the number of "1" bits from the result, may be used.

Thereafter, the determination unit 40 may determine the read voltage to be used with respect to each class, using each of the generated histograms (step S104). As described above, the determination unit 40 may determine, for example, a voltage having a minimum frequency of the histogram as the read voltage.

The present embodiment is different from the related art in that tracking is separately performed according to the read result of the adjacent word line. Detailed tracking method in each class may be arbitrarily changed.

Figure 7:
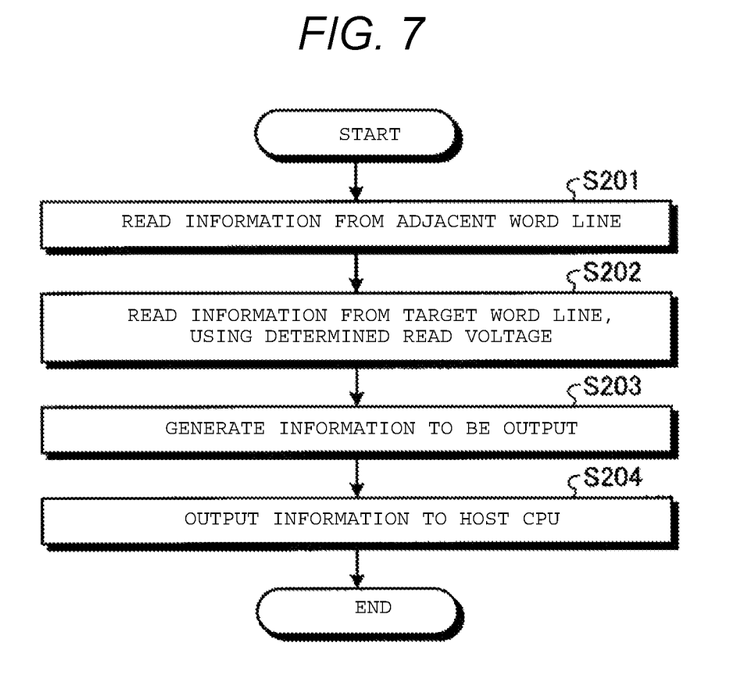
FIG. 7 is a flowchart of read processing according to some embodiments.

After the read voltage is determined by the determination unit 40, the read unit 20 may perform read processing by using the determined read voltage. Hereinafter, a flow of the read processing performed by the memory controller of the present embodiment will be described with reference to FIG. 7. FIG. 7 is a flowchart illustrating an example of the read processing according to the present embodiment.

The read unit 20 reads data from a word line adjacent to a target word line (step S201). A read voltage to be used at this time may be a voltage of a predetermined value. For example, the voltage VB (see FIG. 3) may be used. Next, the read unit 20 may read data from the target word line by using a determined read voltage (step S202).

As described above, the determination unit 40 may determine each read voltage based on levels of threshold voltages of adjacent cells. Accordingly, the read unit 20 may perform a total of two read processing using each read voltage except a case where the determined read voltage values are the same. Instead of the read processing at the step S202, the data read in previous tracking may be stored in the DRAM 4 or the like, and the stored data may be used in the read processing.

Thereafter, the generation unit 50 may integrate the data read by the read unit 20 and generate data (as output data) to be output to the host CPU 100 (step S203). In the present embodiment, the output data may be generated in consideration of a difference between the read voltages depending on the levels of the threshold voltages of the adjacent cells. The generation unit 50 may output the generated output data to the host CPU 100 via, for example, the host controller 6 (step S204).

As described above, the determination unit 40 may determine the optimum read voltage (FIG. 6), and the read unit 20 may perform read processing by using the determined read voltage (FIG. 7).

Next, generation processing of the output data performed by the generation unit 50 will be described. In the following example, the generation unit 50 may select one of the two pieces of data read by the read unit 20, for each cell on a word line, depending on the levels of the threshold voltages of the adjacent cells, and sets the selected data as output data. The generation unit 50 may generate output data Out(k) by using, for example, a bit operation of the following equation (1).

$$\text{Out}(k) = (R1(k) \& N1(k)) | (R2(k) \& N2(k)) \qquad (1)$$

k is information (cell index) for identifying a cell. R1(k) indicates a read result from a target word line when a threshold voltage of an adjacent cell is low. R2(k) indicates a read result from the target word line when the threshold voltage of the adjacent cell is high. N1(k) indicates a read result from the adjacent cell having a low threshold voltage. N2(k) indicates a Boolean NOT value of N1(k). N1(k) corresponds to a mask indicating an adjacent cell having a low threshold voltage. N2(k) corresponds to a mask indicating an adjacent cell having a high threshold voltage. In other words, N1(k) and N2(k) respectively correspond to a mask for a corresponding class, i.e., a mask N1(k) for a class corresponding to a case where the threshold voltage of the adjacent cell is low and a mask N2(k) for a class corresponding to a case where the threshold voltage of the adjacent cell is high.

The bit operation of equation (1) may be performed on a bit unit basis or may be performed on a basis of a plurality of bits (for example, one byte or several bytes). In the nonvolatile memory 2, the higher the read voltage is, the larger the number of cells to be in an ON state increases. Accordingly, if influence of noise is excluded, the number of cells which become "1" as a read result monotonically increases with respect to the read voltage. In addition, generally, the threshold voltage of the cell tends to decrease due to influence of a change in a threshold value caused by lateral migration more in a case where the threshold voltage of the adjacent cell is low than in a case where the threshold voltage of the adjacent cell is high. In addition, as described above, R1(k) and N1(k) are read results in a case where the threshold value of the adjacent cell is low. In consideration of these, in some embodiments, the generation unit 50 may generate Out(k) by using the following equation (2).

$$\text{Out}(k) = R1(k) | (R2(k) \& N2(k)) \quad (2)$$

In a case where an upper page is read in the example of FIG. 3, it is possible to read two threshold levels (VA, VC) and to merge and output the two read results. Accordingly, in some embodiments, the above-described generation processing is performed for each of the two threshold levels, and the generated Out (k) is merged by the controller 3 side (for example, the generation unit 50), and thereby, a reading result of the upper page may be generated.

In some embodiments, page read (that is, data in which read results with multiple read voltages are merged) may be used in the nonvolatile memory 2. If the page read is performed for the upper page in the example of FIG. 3, reading is performed by the two read voltages (VA, VC) in the nonvolatile memory 2, and two read results are merged to be output to the controller 3.

In a case where the page read is used, reading is performed from a read target address by a voltage (for example, VB) corresponding to an intermediate between the two read voltages (VA, VC), in addition to the above reading. If a Boolean AND operation of a result of the reading (or Boolean NOT operation thereof) and a result of the page read is performed, the controller 3 can separate a part obtained by VA and a part obtained by VC from the result of the page read (that is, data in which read results of VA and VC are merged). Then, by respectively performing tracking using the separation results, each read voltage can be determined.

The above-described generation processing need not be performed every time reading is made, and may be performed, for example, in a case where an error occurs in normal read processing, or the like.

According to the above-described method, it is possible to determine an optimum read voltage with respect to a change in a threshold voltage caused by lateral migration of electric charges and to perform reading. Thereby, it is possible to reduce a read error.

First Modification Example

Although a case of a multi-level cell (MLC, 2-bit cell) is described above, the same processing can be performed for a cell in which three bits or more are recorded, such as a triple level cell (TLC, 3-bit cell) and a quad level cell (QLC, 4-bit cell).

In TLC and QLC, a method of allocating a data symbol to the threshold voltage as illustrated in FIG. 3 may be different from that in MLC. Accordingly, positions and the number of threshold levels for reading data of each page may be different from each other. In this case, the above-described generation processing may be performed for each threshold level required for reading, and reading may be performed. In the same manner as in the case of MLC, processing may be performed by utilizing page read. In a case where the number of times of reading at the time of the page read is three or more, it is possible to generate a mask from results of two or more single reading and to perform a Boolean AND operation so as to separate parts of each threshold level from the read results.

Second Modification Example

As described above, instead of using the adjacent word lines adjacent in one direction on one side, adjacent word lines on both sides may be used. In some embodiments, in the nonvolatile memory 2, word lines are arranged as illustrated in FIG. 2. Accordingly, each word line may have two adjacent word lines except for a word line in an end portion. Since the lateral migration of electric charges occurs in both directions adjacent to each other, it is possible to further reduce the read error by considering influence of adjacency in both directions.

In this case, the read unit 20 may first read data from a word line adjacent to a target word line. Reading may be performed for each word line on both sides of and adjacent to the target word line. A voltage used at this time may be a voltage of a predetermined value. For example, the voltage VB (see FIG. 3) may be used. Next, the read unit 20 may read data used for tracking from the target word line.

Next, the determination unit 40 may determine the read voltage. First, the classification unit 30 may classify each cell of the target word line into four classes of "low and low", "low and high", "high and low", and "high and high" from levels of threshold voltages for cells of each adjacent word line. For example, the class "low and low" corresponds to a class in a case where the threshold voltages of the cells of two adjacent word lines are both low.

The determination unit 40 may perform tracking for each of the classified classes. For example, the determination unit 40 may generate a mask by performing a Boolean AND operation of the respective read results of the adjacent word lines and the result obtained by applying Boolean NOT operation to any one of or both of the respective read results of the adjacent word lines. For example, a mask is generated as illustrated in the following equation (3). Each of N1_1 and N1_2 indicates a read result from an adjacent cell which has a low threshold voltage and is provided in one and the other of two adjacent word lines.

$$\text{Mask(low and low)} = N1\_1 \& N1\_2,$$

$$\text{Mask(low and high)} = N1\_1 \& \text{NOT}(N1\_2),$$

$$\text{Mask(high and low)} = \text{NOT}(N1\_1) \& N1\_2,$$

$$\text{Mask(high and high)} = \text{NOT}(N1\_1) \& \text{NOT}(N1\_2) \quad (3)$$

The determination unit 40 may extract cells corresponding to each class using the masks, and determine a read voltage by performing tracking for each of the cells. Thereafter, the read unit 20 may perform reading by using each read voltage determined by the determination unit 40. The read results may be integrated by, for example, the following equation (4).

$$\text{Out}(k) =$$
$$(\text{Mask(low and low)} \& \text{Read(low and low)})$$
$$| (\text{Mask(low and high)} \& \text{Read(low and high)})$$
$$| (\text{Mask(high and low)} \& \text{Read(high and low)})$$
$$| (\text{Mask(high and high)} \& \text{Read(high and high)}) \quad (4)$$

Read (class) indicates a read result from a cell corresponding to the class of a target word line. For example, Read (low and low) indicates a read result from the target word line when threshold voltages of adjacent cells on both sides are low.

Out(k) is a read result for a certain threshold level. The generation unit 50 may generate and output a page read result by combining read results for one or a plurality of threshold levels. Instead of this processing, a page read may be used.

In the above example, cells are classified into four classes depending on the levels of the threshold voltages of the cells on each adjacent word line. Meanwhile, if intervals between the word lines are the same and differences between the threshold voltages of the adjacent cells are the same, influences of the lateral migration in the respective adjacent directions are substantially the same. From this, the class "low and high" and the class "high and low" may be merged instead of using the four classes as described above, and the above-described processing may be performed as three classes. For example, the mask Mask(medium) merged by the following equation (5) may be used as a mask of the merged class.

$$\text{Mask(medium)}=\text{Mask(low and high)}|\text{Mask(high and low)} \quad (5)$$

By reducing the number of classes in this manner, the amount of processing can be reduced.

Third Modification Example

In the above example, single reading is performed for each of one or more adjacent word lines, but at least one of the one or more adjacent word lines may be read multiple times and used for class separation. For example, first, the read unit 20 may perform reading twice or more for each adjacent word line. A voltage used for reading may be a voltage of a predetermined value. For example, when reading is performed n times, $V_{read} \times k/(n+1)$ (k=1, ..., n) may be used as the voltage used for reading.

By combining the n read results, a mask in accordance with a level of a threshold voltage of the adjacent word line can be generated. For example, when reading is performed twice for the adjacent word line (for example, applying a lower read voltage at first, and next applying a higher read voltage), masks of three classes of "low", "medium", and "high" can be generated with respect to the respective adjacent word lines. The masks may be generated, for example, by the following equation (6).

$$\text{Mask(low)}=N1(\text{low}),$$

$$\text{Mask(medium)}=N1(\text{high})\&\text{NOT}(N1(\text{low})),$$

$$\text{Mask(high)}=\text{NOT}(N1(\text{high})) \quad (6)$$

N1(low) indicates a read result from an adjacent cell whose threshold voltage is lower than the first read voltage. N1(high) & NOT(N1(low)) indicates the read result from an adjacent cell whose threshold voltage is higher than the first read voltage and whose threshold voltage is lower than the second read voltage. NOT(N1(high)) indicates a read result from an adjacent cell whose threshold voltage is higher than the second read voltage.

When reading is performed from adjacent word lines on both sides, masks with respect to each combination can be generated by performing a Boolean AND operation of each combination of classes of each word line. When double reading is performed for adjacent word lines on both sides, a mask of 3×3=9 patterns (e.g., Mask (low and low), Mask (low and medium), Mask (low and high), ..., Mask (high and high)) is generated. For example, a mask is generated by the following expression (7) with respect to the class "low and low" in a case where the masks of the adjacent word lines on both sides are "low and low" in common. Mask (low)_1 and Mask(low)_2 represent masks generated with respect to one and the other of two adjacent word lines, respectively. Masks are generated for the other eight classes in the same manner.

$$\text{Mask(low and low)}=\text{Mask(low)}\_1\&\text{Mask(low)}\_2 \quad (7)$$

In the same manner as in a case where single reading is performed for each of the adjacent word lines on both sides, the total number of classes may be reduced by merging classes under conditions in which it is considered that influence of lateral migration is approximately the same. For example, classes (for example, the class "high and medium" and the class "medium and high") in which levels of the threshold voltages of the adjacent word lines on both sides are reversed may be merged into one class.

Thereafter, the read unit 20 may read data used for tracking. The determination unit 40 may determine a read voltage by performing tracking for each cell group corresponding to each mask. Then the read unit 20 may perform reading with each determined reading voltage. The generation unit 50 may integrate the read results and output the results.

Fourth Modification Example

Particularly, in a case where the number of classes increases, the number of corresponding cells per class decreases, and thereby, tracking accuracy may decrease. For example, a case where the read voltage for the class in which the threshold voltage of the adjacent cell is "medium" is calculated substantially or abnormally high compared to the class in which the threshold voltage of the adjacent cell is "high" or "low", or the like can occur. In this case, influence due to the decrease in accuracy may be reduced by applying a filter between the classes, for the read voltage in which tracking is performed. As described above, the lateral migration depends on the threshold voltage of the adjacent cell, and thereby, the amount of influence of the lateral migration is monotonous with respect to the threshold voltage of the adjacent cell, in many cases. The tracking accuracy can be prevented from decreasing by performing filter (e.g., smoothing, and the like) processing between classes.

Fifth Modification Example

As described above, in a case where reading is performed a plurality of times on each of the adjacent word lines on both sides, the number of classes increases, and thus, there is a problem that the number of times of reading from the nonvolatile memory 2 increases and time required for the processing increases. In contrast to this, the number of reading may be reduced by limiting the number of read voltages determined by the determination unit 40. That is, the determination unit 40 may determine a read voltage equal to or less than a predetermined number by setting the same read voltage with respect to at least a part of a plurality of classes.

For example, processing of merging (for example, an average of two classes or a weighted average of two classes) read voltages of the respective classes, processing of determining a read voltage by using the tracking from a histogram obtained by merging histograms of respective classes, and the like may be performed for a plurality of classes in which tracking results (voltages) of the respective classes are similar to each other. The fact that the tracking results are similar to each other indicates, for example, that a difference between voltage values is within a threshold value.

The read voltages may be classified into clusters equal to or less than a predetermined number. In addition, the number of read voltages may be reduced by quantizing the determined read voltages.

The reduction processing may be performed until the number of read voltages becomes equal to or less than a predetermined value (number). Through the processing, it is possible to reduce the number of times of reading of the read unit 20 and to reduce processing time.

Sixth Modification Example

As described above, there is an influence on the threshold voltage due to the CCI in the nonvolatile memory 2. The CCI is a phenomenon in which a target word line is influenced by data written to an adjacent word line (typically, a word line in which writing is next performed). The CCI occurs mainly by voltage application at the time of writing. Accordingly, influence of the CCI changes depending on a method of writing data to the nonvolatile memory 2.

The method of writing data to the nonvolatile memory 2 includes, for example, the following methods:
(1) writing to each word line in turn; and
(2) sequentially writing in multiple stages (for example, a page unit).

In the method of (1), for example, a set of data (in a case of MLC, data of a lower page and an upper page) is written as WL (word line)=0, and then a set of data is written as WL=1. In this case, the amount of influence of the CCI is determined by a level of a threshold voltage of an adjacent (next) word line, thereby, being capable of being handled in the same way as the amount of influence due to the lateral migration.

That is, if a class is set based on the threshold voltages of adjacent word lines on both sides, influence of the lateral migration for the previous word line, and influence due to the lateral migration and the CCI for the next word line are respectively added. Accordingly, it is possible to determine the read voltage obtained by considering the total amount of influence by tracking.

In the method of (1), the number of times of reading may be increased for at least a next word line. For example, if the number of times of reading for the next word line is set to be increased (for example, twice or more), it is possible to determine a plurality of read voltages obtained by considering the influences of the CCI and lateral migration. There is no influence of the CCI on the previous word line, or the influence is slight. Accordingly, the number of times of reading the previous word line may be set to be smaller than the number of times of reading the next word line.

Meanwhile, in the method of (2), for example, in a case of an MLC, data corresponding to lower pages are written to both of the target word line and the next word line, and thereafter, data corresponding to an upper page is written to the target word line. In this case, the CCI occurs only for the writing of the upper page, and thereby, the amount of influence of the CCI is reduced. In addition, the amount of influence of CCI depends on the amount of writing of the upper page, and it is not monotonous with respect to the level of the threshold voltage. For example, in the example of FIG. 3, the influence of CCI on an E level and a B level is small, the influence of CCI on an A level and a C level is large, and the like. In this case, instead of performing classification depending on the threshold voltage of the next word line, cells are classified into classes depending on each level (E level, A level, B level, C level) of the adjacent word line, and setting of the read voltage may be made. Even in other cases (a case of TLC or QLC, and the like), classification may be performed such that the influence of the CCI can be corrected according to the write method, and setting of the read voltage may be made.

Processing according to the present embodiment may be performed in combination with the read method of reducing the influence of the CCI other than the above. For example, in the same manner as a method described in Japanese Patent No. 3913704, a method of correcting the influence of the CCI and performing reading by using processing in the nonvolatile memory 2 may be applied. By performing reading using the method, the influence of the CCI on read data is reduced.

Seventh Modification Example

As described above, the lateral migration of electric charges progresses gradually with time. From this fact, the read voltage determined by the determination unit 40 at a certain read timing can be reused for a short period. The controller 3 may hold the read voltage determined by the determination unit 40 in a storage unit (or a storage, for example, the DRAM 4 or the like), and perform reading by using this value at the next reading. In this case, since there is no need to perform tracking for each of the levels of the threshold voltages of the adjacent word lines, the time required for reading can be reduced. The stored read voltage may be discarded according to a predetermined condition such as elapse of a predetermined time and a case where a read error occurs due to reuse, and tracking may be performed again (multiple times) and a read voltage may be determined. In addition, for example, in order to limit a size of a storage area in which a read voltage is stored, information indicating the read voltage may be sequentially discarded in order of oldest.

Eighth Modification Example

In a case where data of two or more bits is stored in each cell of the nonvolatile memory 2, it is possible to perform reading a plurality of times so as to read the written data. For example, in a case of the MLC illustrated in FIG. 3, 2-bit data can be read by performing reading at three reading positions of VA, VB, and VC. Here, the determination unit 40 may determine by interpolating or extrapolating the read voltage (or first voltage) in a part of a plurality of read positions, based on the read voltage (or second voltage) set in another read position. The interpolation or extrapolation may be, for example, linear (or primary) interpolation or linear (or primary) extrapolation. In addition, for example, a relationship between a first voltage and a second voltage may be obtained in advance by a regression performed by a primary equation or a polynomial equation, and the first voltage may be determined from the second voltage, based on the relationship.

For example, in a case of the MLC, the determination unit 40 may determine by interpolating the respective read voltages of the B level (see FIG. 3), based on the determination results of the respective read voltages at the A level and the C level. A weight used for interpolation may be determined based on a relationship between predetermined voltages (for example, VA, VB, and VC). In addition, also in the same manner, in a case of TLC and QLC, read voltages at other read positions may be determined by being interpolated or extrapolated from the determination result of the read voltage for a part of the read positions.

Ninth Modification Example

There is no need to use all cells on a word line for data used for tracking, and only a part of the cells on the word line may be used. For example, the read unit 20 may read data from a part of the cells on the word line as data used for the tracking. Apart of the cells to be read may be determined by any method. For example, a method of setting the cell in a range of four kiB (4*1024 bytes) from the beginning of a word line, a method of selecting by sampling, and the like can be applied.

The determination unit 40 may perform tracking using data read from a part of the cells. In the nonvolatile memory 2, each cell on the word line is written at the same timing, and thus, the amount of influence of lateral migration may be substantially equal. By determining a read voltage from a part of data on the word line, the time taken to read the data and the time taken for tracking (generation of a histogram of each class, and the like) can be reduced.

Tenth Modification Example

Up to now, an example in which the controller 3 performs each processing is described. At least a part of the processing performed by the controller 3 may be performed by the nonvolatile memory 2. For example, all or a part of the read processing after determining the read voltage may be performed by the nonvolatile memory 2. For example, a bit operation circuit mounted on the nonvolatile memory 2 may perform a part or all of generation of various masks, tracking, combined processing of read data, and the like, from read data of the data buffer 8.

For example, the bit operation circuit may read data from the controller 3 by using each of a plurality of read voltages which are input and may store the data in the data buffer 8. The bit operation circuit may perform a bit operation using the stored data, combine the data obtained by the operation with data, and output the combined data to the controller 3. In addition, as an alternative, a configuration may be allowed in which the bit operation circuit performs read processing of each of a plurality of classes, and the controller 3 may perform processing of integrating a plurality of read results.

In a case where processing for the read data is performed by the controller 3, the data to be transferred from the nonvolatile memory 2 to the controller 3 may increase, and also a delay in transmission may increase. By performing a part or all of the processing in the nonvolatile memory 2, influence of the delay can be reduced. Meanwhile, in many cases, a processing circuit and a memory size are limited in the nonvolatile memory 2, and in these cases, as the controller 3 performs processing, more complicated (and precise) processing can be realized.

In addition, at least a part of the processing performed by the controller 3 may be performed by an external device of the memory system 1 (for example, the host CPU 100, a server device built on a cloud environment, and the like). As such, the function of the controller 3 can be provided in a memory system including at least a part of the controller 3, the nonvolatile memory 2, the host CPU 100, and the like.

Eleventh Modification Example

The determination unit 40 may obtain a relationship between a threshold voltage of an adjacent cell and a read voltage of a cell belonging to each class, and determine a read voltage using the obtained relationship. For example, instead of directly determining the read voltage, the determination unit 40 may obtain a function indicating a relationship between the threshold voltage of the adjacent cell and an optimum read voltage, and determine the read voltage, based on the function.

Figure 8:
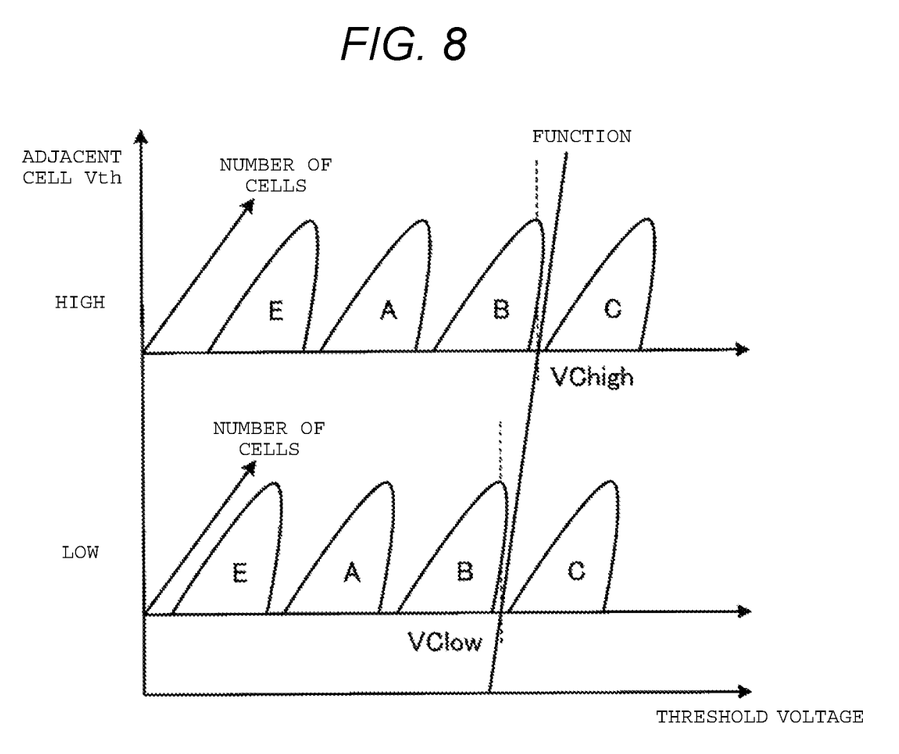
FIG. 8 is a diagram illustrating a method of determining a read voltage according to a modification example according to some embodiments.

FIG. 8 illustrates an example in which an adjacent word line on one side is considered. As illustrated in FIG. 8, in the present modification example, a function indicating a relationship between a threshold voltage of the adjacent cell and a read voltage is obtained from two or more histograms in accordance with a level of the threshold voltage of the adjacent cell. In a case of the example of FIG. 8, for example, a histogram of two classes (i.e., a class with a high threshold voltage of an adjacent cell and a class with a low threshold voltage of an adjacent cell) may be generated, and a read voltage may be calculated by performing tracking for each class.

The determination unit 40 may determine a function by using a straight line connecting points given by each calculated read voltage and a representative threshold value (for example, an average threshold value of the cells of each class, a central threshold value of a section of each class, or the like) of each class. Alternatively, tracking may be performed in more classes (for example, three classes of high, medium, and low of adjacent cells), and the function may be determined from each obtained point by a regression analysis (for example, linear regression, or the like).

In addition to considering the adjacent word line on one side illustrated in FIG. 8, a function may be obtained by considering adjacent word lines on both sides. Also in a case where the adjacent word lines on both sides are considered, tracking is performed for each class in the same manner as in the above-described embodiment. Thereafter, a function passing through points given by the obtained read voltage and a threshold voltage of the adjacent cell is obtained. Alternatively, the determination unit 40 may obtain the function by using regression analysis. In a case where the amount of influence of the lateral migration of the adjacent word lines on both sides is separately evaluated, a level of the threshold voltage of the adjacent cell is two-dimensional (e.g., low and low, high and low, and the like), and thereby, the obtained function is a plane shape (e.g., flat plane, and the like). Alternatively, in a case where the amount of influence of the lateral migration of the adjacent word lines on both sides can be regarded as substantially the same, a total value of each threshold voltage may be used as the threshold voltage of the adjacent cell. In this case, the obtained function is a line (or straight line).

Thereafter, the determination unit 40 may determine a read voltage by using the obtained function. In the present modification example, since a relationship between the threshold voltage of the adjacent cell and the read voltage is obtained as a function, it is possible to determine an optimum read voltage with respect to the threshold voltage of any adjacent cell. By using this, the number of classes to be used for reading (or read classes or a second group of classes) is set to be larger than the number of classes to be used for determining a function (a first group of classes), and the read voltages of each read class may be determined from the function. The read unit 20 may read data of the cells of each read class (i.e., each of the second group of classes), based on the determined read voltage (e.g., the read voltage determined using the first group of classes).

According to the present modification example, by obtaining a function from the tracking result of the small number of classes and determining the read voltages of the more read classes, the amount of processing taken in determining the read voltage can be reduced. The number of read voltage may be limited by applying the above fifth modification example such that the number of read voltages is determined so as not to increase due to an increase in the number of read classes.

In the above-described example, a straight line or a flat plane is assumed as a function, but a shape of the function is not limited to this and may be approximately a curved line or a curved surface formed by, for example, a quadratic function (or a cubic or higher order polynomial function), an exponential function, a logarithmic function or the like.

In the present modification example, when a function is obtained, parameters (such as coefficients) of the function may be directly obtained from a plurality of read results (for example, cell count number) instead of performing tracking. In this case, a function (a second function, for example, a function of a primary or multiple order) with coefficients or the like may be prepared in advance from a plurality of read results to be used. The second function may be prepared by previously learning (e.g., regression analysis and the like) a relationship between the read results and the parameters of the function.

As described above, influence of CCI differs depending on a method of writing to the nonvolatile memory 2. Also in the present modification example, in a case where writing is performed in turn for each word line, the CCI can be handled in the same manner as lateral migration for the next word line. That is, by separately evaluating a previous word line and a next word line (that is, evaluating a function as a plane) when obtaining the function, a function in which the CCI is considered can be obtained.

Meanwhile, in a case where writing is performed on a page basis, influence of the CCI may not be monotonous with respect to a level of a threshold voltage of an adjacent cell. Accordingly, in a straight line (or a curved line, a flat plane, or the like) illustrated in FIG. 8, a relationship between the threshold voltage and the read voltage may not be accurately approximated. In this case, a function may be prepared in consideration of a "shape" of interference in accordance with a write method. For example, in a case where sequential write in a page unit basis is performed with respect to the MLC illustrated in FIG. 3, the CCI is small when a level of an adjacent cell is an E level or a B level, and is large when the level of the adjacent cell is an A level or a C level. From this, the determination unit 40 may use a function such as the following equation (8).

$$F(\text{adjacent cell threshold voltage } Vth=x)=ax+b \text{ if } x<VA \text{ or } (VB<x<VC), ax+b+c \text{ otherwise} \quad (8)$$

a, b, and c are coefficients, and are calculated by a regression analysis or the like, based on tracking results in each class. In addition, as described above, also in the present modification example, processing may be performed by using a read method (Japanese Patent No. 3913704 and the like) for reducing influence of the CCI.

Twelfth Modification Example

In the eleventh modification example, instead of obtaining a function indicating the relationship between the threshold voltage of the adjacent cell and the optimum read voltage, the read voltage in the class (read class, second group of classes) to be used for reading may be directly determined. Instead of performing tracking based on each reading result (e.g., count number of cells) of the first group of classes, the determination unit 40 may input this to each function corresponding to each of the second group of classes and determine the read voltage. The function may indicate a correspondence between each read result (e.g., count number) of the first class and each read voltage of each of the second group of classes, and may be, for example, a linear function or a quadratic or higher order polynomial function. The function may be prepared by previously learning (e.g., regression analysis) the relationship between the read result and the optimum read voltage.

Hardware Configuration

Each unit (the write unit 10, the read unit 20, the classification unit 30, the determination unit 40, the generation unit 50, and the ECC processing unit 60) in the nonvolatile memory controller 5 (controller 3) is implemented by, for example, one or a plurality of processors. For example, each of the above-described units may be implemented by a processor such as a central processing unit (CPU) to execute a program, that is, by software. In addition, each of the above-described units may be implemented by a processor such as a dedicated integrated circuit (IC), that is, by hardware. In addition, each of the above-described units may be implemented by using software and hardware in combination. In a case where a plurality of processors are used, each processor may provide one of the above-described units, or may provide two or more of the above-described units.

As described above, according to some embodiments, it is possible to realize much error reduction even with respect to a nonvolatile memory in which an error rate varies for each bit due to influence of a threshold voltage of an adjacent cell.

A program executed by a memory controller of some embodiments is provided by being incorporated in a ROM or the like in advance.

The program executed by the memory controller of some embodiments may be recorded as a file in an installable format or in an executable format in a computer-readable recording medium such as a compact disk read only memory (CD-ROM), a flexible disk (FD), a compact disk recordable (CD-R), and a digital versatile disk (DVD) to be provided as a computer program product.

Furthermore, a program executed by the memory controller of some embodiments may be stored in a computer connected to a network such as the Internet and may be provided by being downloaded via a network. In addition, a program executed by the memory controller of some embodiments may be provided or distributed via a network such as the Internet.

A program executed by the memory controller of some embodiments allows a computer to function as each unit of the above-described memory controller. The computer can read to execute a program from a computer-readable storage medium on a main storage device by using a CPU.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A memory system comprising:
a nonvolatile memory that includes a first word line and a second word line adjacent to the first word line, the first word line including a plurality of first cells and the second word line including a plurality of second cells; and
a memory controller configured to
determine a read voltage to be used with respect to the plurality of the first cells, based on a plurality of adjacent voltages representing respective threshold voltages of the plurality of the second cells,
read data from the first word line using a plurality of determined read voltages, and
classify the plurality of first cells into a first group of classes according to the plurality of adjacent voltages and determine the read voltage based on a distribution of threshold voltages of cells belonging to one of the first group of classes.

2. The memory system according to claim 1,
wherein the memory controller is further configured to determine the read voltage based on a histogram indicating the number of cells for each threshold voltage of cells belonging to one of the first group of classes.

3. The memory system according to claim 1,
wherein the memory controller is further configured to obtain a relationship between the plurality of adjacent voltages and read voltages of cells belonging to a corresponding one of the first group of classes and determine the read voltage using the relationship.

4. The memory system according to claim 3,
wherein the memory controller is further configured to:
classify the plurality of first cells into a second group of classes more than the first group of classes, according to the plurality of adjacent voltages; and
determine the read voltage to be used with respect to the second group of classes using the relationship.

5. The memory system according to claim 1,
wherein the memory controller is further configured to determine read voltages such that the number of read voltages is less than or equal to a predetermined number by setting the same read voltage with respect to at least two of the first group of classes.

6. The memory system according to claim 1,
wherein the memory controller is further configured to apply a plurality of masks to be determined according to the first group of classes to data read from the first word line by using each of the plurality of determined read voltages, and generate output data obtained by integrating applied results of the plurality of masks.

7. The memory system according to claim 1, further comprising:
a storage that stores information indicating the determined read voltage,
wherein the memory controller is further configured to read data from the first word line using the read voltage stored in the storage.

8. The memory system according to claim 1,
wherein the memory controller is further configured to determine the read voltage by interpolating or extrapolating a first voltage included in a plurality of read voltages corresponding to a plurality of read positions according to the number of bits of data, based on a second voltage included in the plurality of read voltages.

9. A read method comprising:
determining a read voltage to be used with respect to a plurality of first cells provided in a first word line, according to a plurality of adjacent voltages representing respective threshold voltages of a plurality of second cells provided in a second word line adjacent to the first word line;
reading data from the first word line using a plurality of determined read voltages; and
classifying the plurality of first cells into a first group of classes according to the plurality of adjacent voltages and determining the read voltage based on a distribution of threshold voltages of cells belonging to one of the first group of classes.

10. A non-transitory computer-readable medium on which a program is recorded, the program causing a computer to perform:
determining a read voltage to be used with respect to a plurality of first cells provided in a first word line, according to a plurality of adjacent voltages representing respective threshold voltages of a plurality of second cells provided in a second word line adjacent to the first;
reading data from the first word line using a plurality of determined read voltages; and
classifying the plurality of first cells into a first group of classes according to the plurality of adjacent voltages and determining the read voltage based on a distribution of threshold voltages of cells belonging to one of the first group of classes.

11. A memory controller comprising:
a function of determining a read voltage to be used with respect to a plurality of first cells provided in a first word line, according to a plurality of adjacent voltages representing respective threshold voltages of a plurality of second cells provided in a second word line adjacent to the first word line; and
a function of reading data from the first word line using a plurality of determined read voltages; and
a function of classifying the plurality of first cells into a first group of classes according to the plurality of adjacent voltages and determining the read voltage based on a distribution of threshold voltages of cells belonging to one of the first group of classes.

* * * * *